United States Patent
Ahn et al.

(10) Patent No.: US 7,709,340 B2
(45) Date of Patent: May 4, 2010

(54) SEMICONDUCTOR INTEGRATED CIRCUIT DEVICE AND METHOD OF MANUFACTURING THE SAME

(75) Inventors: Jong-hyon Ahn, Suwon-si (KR); Jae-cheol Yoo, Suwon-si (KR); Ki-seog Youn, Suwon-si (KR); Kwan-jong Roh, Gunpo-si (KR); Su-gon Bae, Suwon-si (KR); Ki-young Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 11/705,164

(22) Filed: Feb. 12, 2007

(65) Prior Publication Data

US 2007/0187770 A1    Aug. 16, 2007

(30) Foreign Application Priority Data

Feb. 13, 2006    (KR) ...................... 10-2006-0013893

(51) Int. Cl.
    *H01L 21/20*    (2006.01)
(52) U.S. Cl. .............................. 438/381; 257/E27.098; 257/E21.661
(58) Field of Classification Search ................. 438/142, 438/197, 299, 305, 381, 384, 586; 257/E27.098, 257/E21.661
See application file for complete search history.

(56) References Cited

U.S. PATENT DOCUMENTS

| 6,806,180 | B2 * | 10/2004 | Cho et al. .................... 438/618 |
| 6,982,465 | B2 | 1/2006 | Kumagai et al. |
| 7,060,549 | B1 * | 6/2006 | Craig et al. .................. 438/199 |
| 7,105,394 | B2 | 9/2006 | Hachimine et al. |
| 2003/0040158 | A1 | 2/2003 | Saitoh |
| 2005/0285202 | A1 * | 12/2005 | Huang et al. ................. 257/368 |

FOREIGN PATENT DOCUMENTS

| JP | 2003-086708 | 3/2003 |
| JP | 2003-273240 | 9/2003 |

* cited by examiner

*Primary Examiner*—Brook Kebede
(74) *Attorney, Agent, or Firm*—Lee & Morse, P.C.

(57) ABSTRACT

A semiconductor integrated circuit device may include a semiconductor substrate, a static memory cell on the semiconductor substrate, a tensile stress film on the pull-down transistors, and a compressive stress film on the pass transistors. The static memory cell may include multiple pull-up transistors and pull-down transistors, which form a latch, and multiple pass transistors may be used to access the latch.

19 Claims, 8 Drawing Sheets

SEMICONDUCTOR INTEGRATED CIRCUIT DEVICE AND METHOD OF MANUFACTURING THE SAME

BACKGROUND OF THE INVENTION

1. Field of the Invention

The present invention relates to a semiconductor integrated circuit device and a method of manufacturing the device, more particularly, to a semiconductor integrated circuit device having memory cells and a method of manufacturing the device.

2. Description of the Related Art

The memory size of a static random access memory (SRAM) is smaller than that of a dynamic random access memory (DRAM). However, the processing speed of SRAMs is faster than that of DRAMs. For this reason, SRAMs have been widely used in cache memories of computers or portable appliances that require high processing speed.

Static memory cells can be classified into thin film transistor (TFT) cells, full complementary metal oxide semiconductor (FCMOS) cells, etc. An FCMOS cell may include multiple pull-up transistors and pull-down transistors, which may form a latch, and multiple pass transistors may be used to access to the latch.

However, as the integration density of semiconductor memory elements has increased, the size of memory cells has become reduced and stable operation of the memory cells has become more important.

Also, as the static noise margin (SNM) increases, the stability of memory cells may improve. In addition, as the cell ratio increases, the static noise margin may increase. As a result, there is a requirement for new technologies that may produce stable memory cells having reduced size.

SUMMARY OF THE INVENTION

The present invention is therefore directed to a semiconductor integrated circuit device which substantially overcomes one or more of the problems due to the limitations and disadvantages of the related art.

It is therefore a feature of the present invention to provide a semiconductor integrated circuit device having memory cells with improved stability, and a method of manufacturing the same.

At least one of the above and other features and advantages of the present invention may be realized by providing semiconductor integrated circuit device that may include a semiconductor substrate, a static memory cell that may be formed on the semiconductor substrate, where the static memory cell may include multiple pull-up transistors and pull down transistors, which may form a latch, a tensile stress film that may be formed on the pull-down transistors, and a compressive stress film that may be formed on the pass transistors.

Each of the tensile and compressive stress films may be an SiN or SiNx film. A ratio of N—H bonding to Si—H bonding in the SiN or $SiN_x$ film that serves as the tensile stress film may be adjusted to be smaller than the ratio in the SiN or $SiN_x$ film that serves as the compressive stress film. A tensile stress of the tensile stress film may be about 500 MPa or more. An absolute value of a compressive stress of the compressive stress film may be about 500 MPa or more. Each of the pull-down transistors and the pass transistors may be an NMOS transistor. The electron mobility of each pull-down transistor may be higher than that of each pass transistor. Each of the pull-up transistors may be a PMOS transistor. The compressive stress film may additionally be formed on the pull-up transistors.

At least one of the above and other features and advantages of the present invention may be realized by providing a method of manufacturing a semiconductor integrated circuit device that may include providing a semiconductor substrate, forming a static memory cell that may be on the semiconductor substrate, and the static memory cell may include multiple pull-up transistors and pull-down transistors, which may form a latch, forming a tensile stress film that may be on the pull-down transistors, and forming a compressive stress film that may be on the pass transistors.

The forming of the tensile stress film on the pull-down transistors and forming of the compressive stress film on the pull-up transistors and the pass transistors may include forming the tensile stress film on the surface of the semiconductor substrate, removing the tensile stress film from the pull-up transistors and the pass transistors, forming the compressive stress film on the surface of the semiconductor substrate, and removing the compressive stress film from the pull-down transistors. The forming of the tensile stress film on the pull-down transistors and forming of the compressive stress film on the pull-up transistors and the pass transistors may include forming the compressive stress film on the surface of the semiconductor substrate, removing the compressive stress film from the pull-up transistors and the pass transistors, forming the tensile stress film on the surface of the semiconductor substrate, and removing the tensile stress film from the pull-up transistors and the pull-down transistors.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
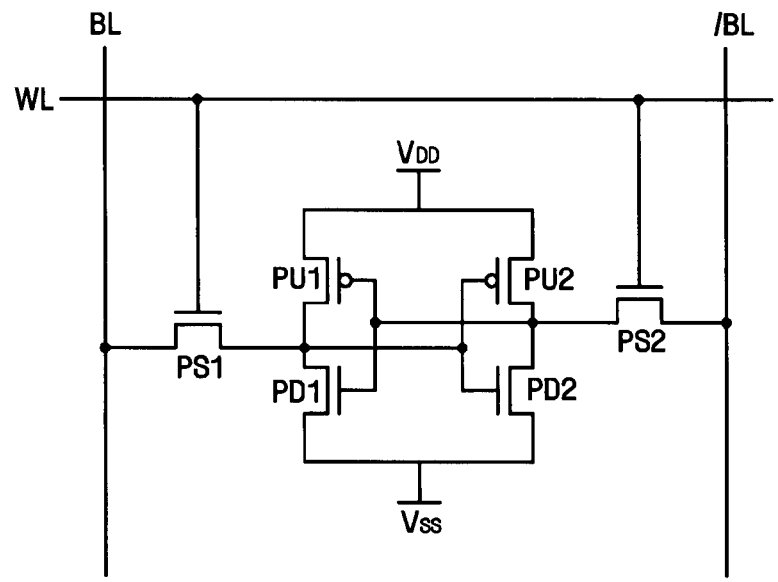
FIG. 1 illustrates a circuit diagram of a static memory cell of a semiconductor integrated circuit device according to an embodiment of the invention.

Korean Patent Application No. 10-2006-0013893 filed on Feb. 13, 2006, in the Korean Intellectual Property Office, and entitled: "Semiconductor Integrated Circuit Device and Method of Manufacturing the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

The same components are represented by the same reference numerals in the present specification. The term "and/or" is used to mean each described item and one or more combinations of the items.

Terms used in the context of describing the invention are used to describe embodiments, and should not be construed as limiting the invention. The use of singular terms in the context of describing the invention may also be construed to cover the plural, unless otherwise indicated herein or clearly contradicted by context.

According to the semiconductor integrated circuit device and a method of manufacturing the device of the present invention, at least one of the following effects may be obtained.

First, since it may be possible to improve the current drivability of a pull-down transistor and to lower the current drivability of a pass transistor, it may be possible to increase the cell ratio.

Second, since it may be possible to increase the cell ratio so as to increase the static noise margin, it may be possible to improve the stability of a memory cell.

Hereafter, the constitution of a semiconductor integrated circuit device according to an embodiment of the present invention will be described in detail with reference to FIGS. 1 to 3.

FIG. 1 illustrates a circuit diagram of a static memory cell of a semiconductor integrated circuit device according to an embodiment of the present invention.

As illustrated in FIG. 1, a semiconductor integrated circuit device according to an embodiment of the present invention may include a static memory cell. The static memory cell may include multiple pull-up transistors PU1 and PU2 and pull-down transistors PD1 and PD2 that may form a latch. Multiple pass transistors may be used to access to the latch.

In FIG. 1, a unit cell of the static memory cell may include first and second pass transistors PS1 and PS2, first and second pull-down transistors PD1 and PD2, and first and second pull-up transistors PU1 and PU2. Here, each of the first and second pass transistors PS1 and PS2 and the first and second pull-down transistors PD1 and PD2 may be an NMOS transistor, and each of the first and second pull-up transistors PU1 and PU2 may be a PMOS transistor.

The sources of the first and second pull-down transistors PD1 and PD2 may be connected to a ground line $V_{SS}$, and the sources of the first and second pull-up transistors PU1 and PU2 may be connected to a power feed line $V_{DD}$.

Further, the first pull-down transistor PD1 formed of an NMOS transistor and the first pull-up transistor PU1 formed of a PMOS transistor may form a first inverter. The second pull-down transistor PD2 formed of an NMOS transistor and the second pull-up transistor PU2 formed of a PMOS transistor may form a second inverter. That is, each of the pull-down transistors and the pass transistors may be an NMOS transistor, and each of the pull-up transistors may be a PMOS transistor.

The output terminals of the first and second inverters may be connected to the sources of the first and second pass transistors PS1 and PS2, respectively. The input terminals and output terminals of the first and second inverters may alternately connect to form one latch circuit.

In addition, the drains of the first and second pass transistors PS1 and PS2 may be connected to first and second bit lines BL and /BL, respectively.

Figure 2:
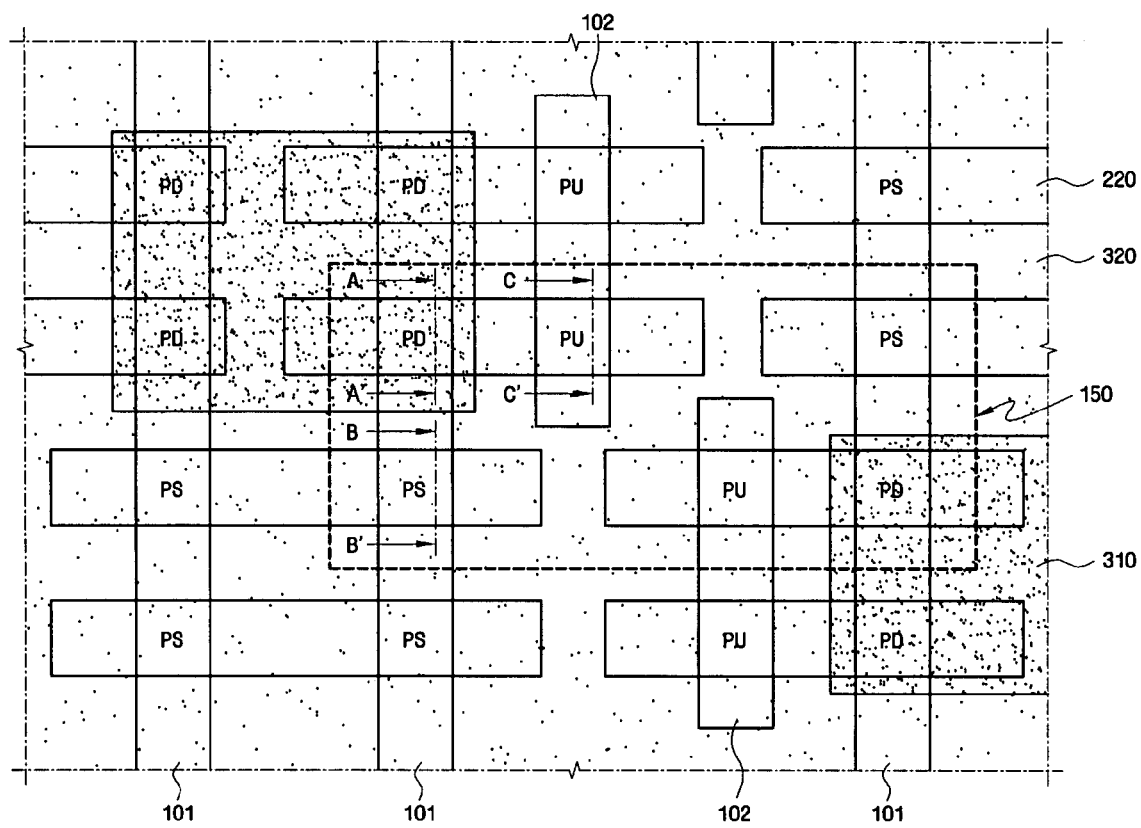
FIG. 2 illustrates a layout of the semiconductor integrated circuit device according to an embodiment of the invention.

FIG. 2 illustrates a layout of the semiconductor integrated circuit device according to an embodiment of the present invention. FIG. 3 illustrates a cross-sectional view taken along lines A-A', B-B', and C-C' of FIG. 2.

Figure 3:
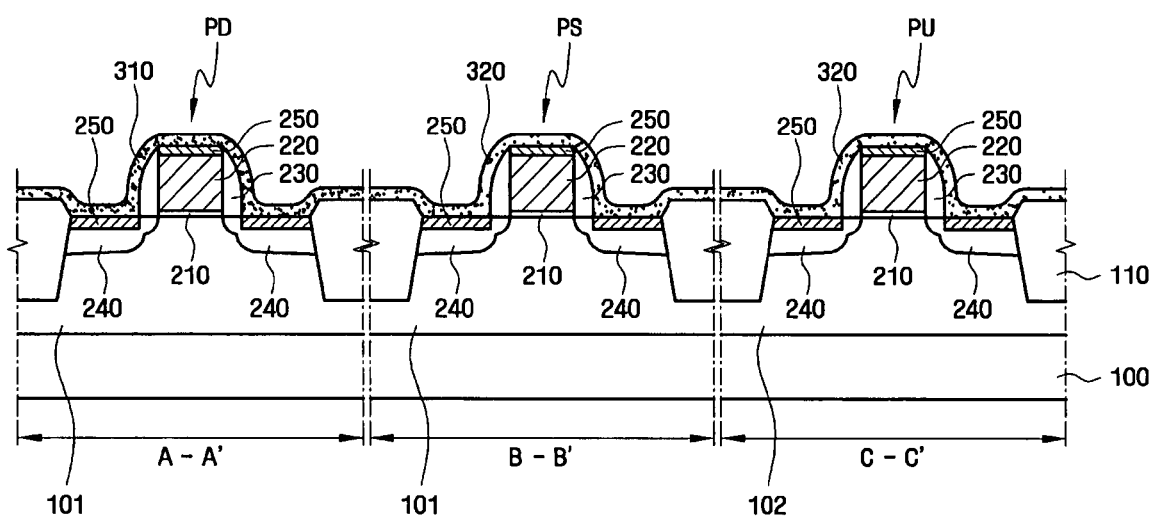
FIG. 3 illustrates a cross-sectional view taken along lines A-A', B-B', and C-C' of FIG. 2.

Referring to FIGS. 2 and 3, first and second active regions 101 and 102 may be defined by element isolation regions 110 on a semiconductor substrate 100 of the semiconductor integrated circuit device.

The semiconductor substrate 100 may be, e.g., a silicon substrate, a silicon-on-insulator (SOI) substrate, a gallium arsenide (GaAs) substrate, a silicon germanium (SiGe) substrate, a ceramic substrate, a quartz substrate, or a glass substrate. The substrates may be used for a display. Each of the element isolation regions 110 may be, e.g., a field oxide (FOX) region or a shallow trench isolation (SOI) region formed by a local oxidation of silicon (LOCOS) method.

Gates 220 may be formed to cross the first and second active regions 101 and 102. Transistors may be formed in regions where the first and second active regions 101 and 102 and the gates 220 intersect. The pull-down transistors PD and pass transistors PS may be formed in regions where the first active region 101 and the gates 220 intersect, and the pull-up transistors PU may be formed in regions where the second active region 102 and the gates 220 intersect. Here, each of the pull-down transistors PD and pass transistors PS may be an NMOS transistor, and each of the pull-up transistors PU may be a PMOS transistor. A unit cell 150 of the static memory cell may include includes two pull-down transistors PD, two pass transistors PS, and two pull-up transistors PU.

Each of the pull-down transistors PD, the pull-up transistors PU, and the pass transistors PS may include a gate insulating film 210, the gate 220, spacers 230, source and drain regions 240, and a silicide layer 250.

The gate 220 may provided on the first and second active regions 101 and 102, and the gate insulating film 210 may be formed under the gate 220.

The material of the gate insulating film 210 may be, e.g., $SiO_2$, $SiON$, $Si_3N_4$, $SiN_x$, $Ge_xO_yN_z$, $Ge_xSi_yO_z$, a high-dielectric material, or laminates thereof. The high-dielectric material may be, e.g., $HfO_2$, $ZrO_2$, $Al_2O_3$, $Ta_2O_5$, hafnium silicate, zirconium silicate, etc.

The gates 220 may be formed on the gate insulating film 210, and may be made of, e.g., polysilicon, polysilicon having ion-implanted impurities, etc. Further, each of the gates may include a metal film and, if necessary, may include a film made of other materials.

The spacers 230 may be formed on both sidewalls of each gate 220. The source and drain regions 240, which have a lightly doped drain (LDD) configuration, may be formed in the first and second active regions 101 and 102 on both sides of each gate 220.

The silicide layer 250 may be formed on the gates 220 and the source and drain regions 240. The silicide layer 250 may reduce contact resistance during the formation of contacts that electrically connect wires with the gates 220 or the source and drain regions 240.

Also, a tensile stress film 310 may be provided on the pull-down transistor PD, and a compressive stress film 320 may be formed on the pass transistor PS and the pull-up transistor PU. The tensile stress film 310 and/or the compressive stress film 320 may be, e.g., an SiN or $SiN_x$ film.

Determining whether the SiN or $SiN_x$ film applies tensile stress or compressive stress to the transistor may depend on a ratio of N—H bonding to Si—H bonding in the film. That is, if the ratio of N—H bonding to Si—H bonding is in a range of about 1 to 5, the SiN or $SiN_x$ film may apply tensile stress to the transistor. If the ratio of N—H bonding to Si—H bonding is in a range of about 5 to 20, the SiN or $SiN_x$ film may apply compressive stress to the transistor. Accordingly, the ratio of N—H bonding to Si—H bonding in a SiN or $SiN_x$ film which serves as the tensile stress film 310 may be adjusted to be in a range of about 1 to 5. In addition, the ratio of N—H bonding to Si—H bonding in an SiN or $SiN_x$ film which serves as the compressive stress film 320 may be adjusted to be in a range of about 5 to 20, e.g., about 10 to 15. In other words, the ratio of N—H bonding to Si—H bonding in the SiN or $SiN_x$ film, which serves as the tensile stress film, may be adjusted to be smaller than that in the SiN or $SiN_x$ film, which serves as the compressive stress film.

Further, the tensile stress of the tensile stress film 310 may be adjusted to be, e.g., about 500 MPa or more. Also, the absolute value of the compressive stress of the compressive stress film 320 may be adjusted to be, e.g., about 500 MPa or more.

If tensile stress is applied to an NMOS transistor, electron mobility may increase in the NMOS transistor. An increase of electron mobility may cause current drivability to improve in the NMOS transistor. Therefore, the on-current value (Ion) of the transistor may increase.

In contrast, if compressive stress is applied to an NMOS transistor, electron mobility may decrease in the NMOS transistor. The decrease of the electron mobility may cause current drivability to deteriorate in the NMOS transistor. Therefore, the current value Ion of the transistor may decrease as a result of the compressive stress.

If compressive stress is applied to a PMOS transistor, electron mobility may increase in the PMOS transistor. For this reason, current drivability may increase in the PMOS transistor, and the current value Ion of the PMOS transistor may decrease.

An additional consideration is the static noise margin (SNM) increase in the static memory cell, which may improve the stability of the cell. The static noise margin means a margin of a region that is formed by characteristic curves representing the stabilized voltage of the first and second inverters.

The stabilized voltage may be destabilized due to, e.g., external noise, variation of processes, or asymmetry of the first and second inverters. In this case, as the static noise margin increases, the stability of the cell may improve against the external noise.

A further consideration is the cell ratio. Cell ratio means a ratio of the current value Ion of the pull-down transistor PD to the current value Ion of the pass transistor PS. As the cell ratio increases, the static noise margin may increase. Therefore, as the current value Ion of the pull-down transistor PD increases or the current value Ion of the pass transistor PS decreases, the cell ratio may increase. For this reason, it may be advantageous to individually control the current values Ion of the pull-down transistor PD and the pass transistor PS.

When the tensile stress film 310 is formed on the pull-down transistor PD, the electron mobility of the pull-down transistor PD may increase. As a result, the current value Ion of the pull-down transistor PD may increase. In addition, when the compressive stress film 320 is formed on the pass transistor PS, the electron mobility of the pass transistor PS may decrease. Therefore, the electron mobility of each pull-down transistor PD may be higher than that of each pass transistor PS. As a result, the current value Ion of the pass transistor PS may decrease. As the cell ratio increases, the static noise margin may increase. Accordingly, it may be possible to improve the stability of the cell.

Hereafter, stages of a method of manufacturing a semiconductor integrated circuit device according to another embodiment of the present invention will be described with reference to FIGS. 4A to 10.

Figure 4A:
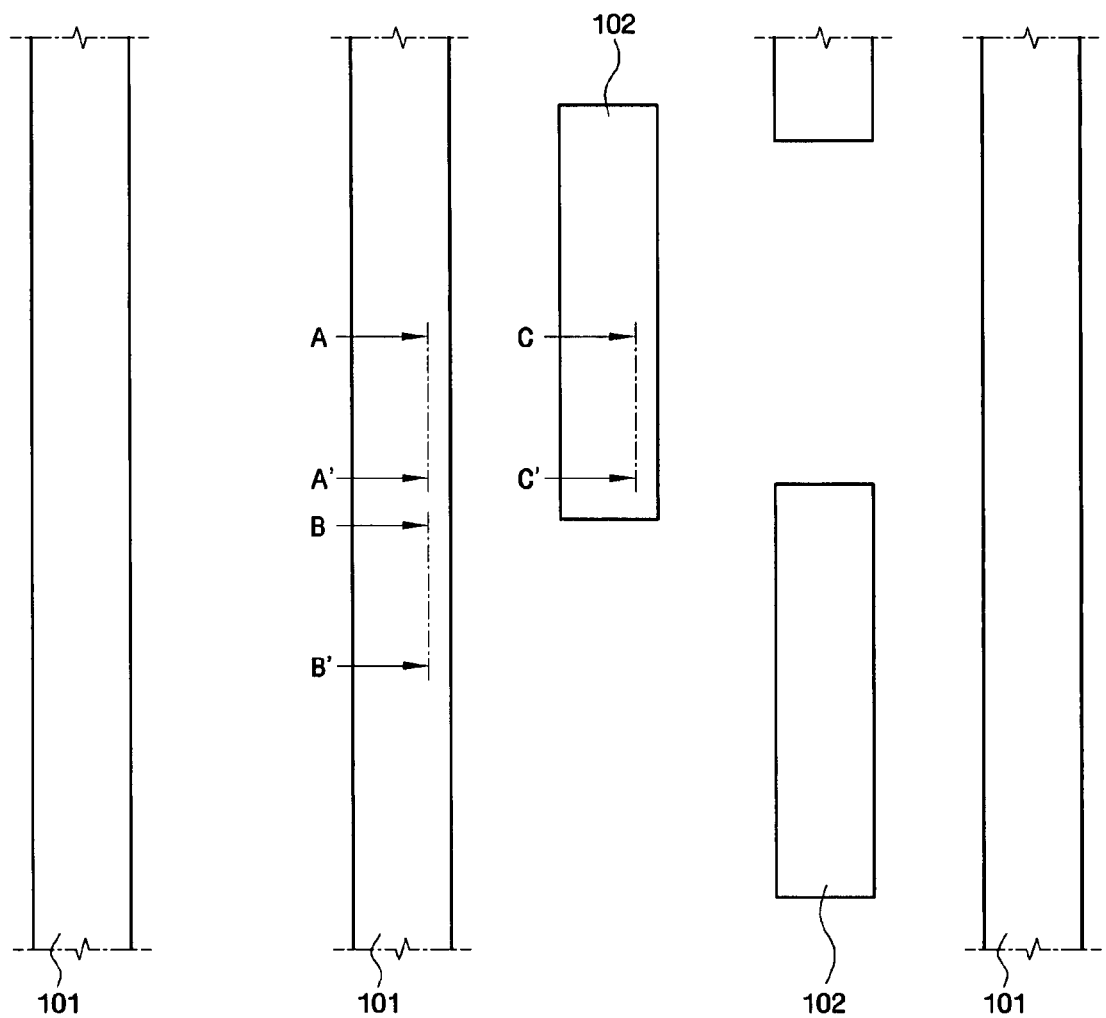
FIGS. 4A to 10 illustrate views of stages in a method of manufacturing a semiconductor integrated circuit device according to another embodiment of the invention.
Figure 4B:
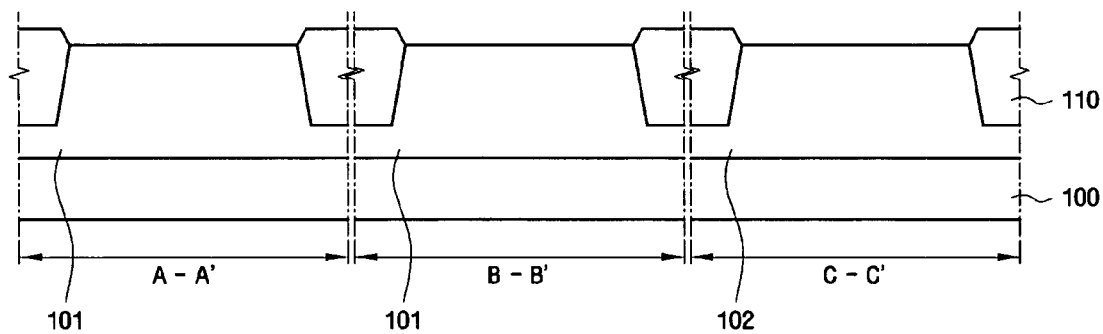

First, as shown in FIGS. 4A and 4B, element isolation regions 110, which define the first and second active regions 101 and 102, may be formed on the semiconductor substrate 100. Subsequently, ions of N-type and P-type impurities may be selectively implanted into the semiconductor substrate 100, on which the element isolation regions 110 may be formed, so as to form the first and second active regions 101 and 102.

Figure 5A:
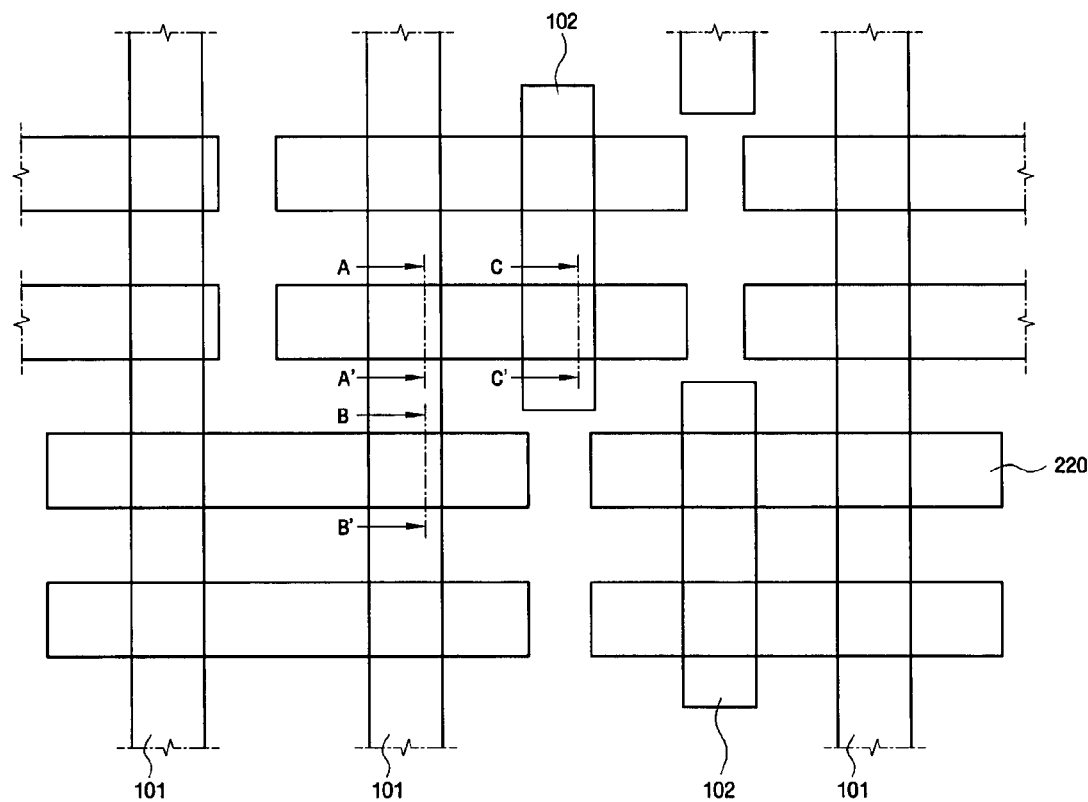
Figure 5B:
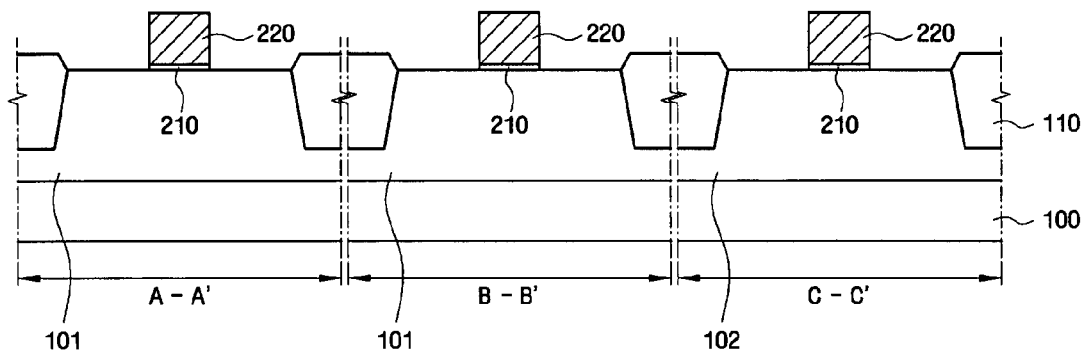

Subsequently, as shown in FIGS. 5A and 5B, the gates 220 may be formed to cross the first and second active regions 101 and 102. In this case, the gate insulating film 210 may be formed under the gates 220. Specifically, an insulating film and a conductive film may be sequentially laminated on the first and second active regions 101 and 102, and may then be patterned to form the gate insulating film 210 and the gates 220.

Figure 6A:
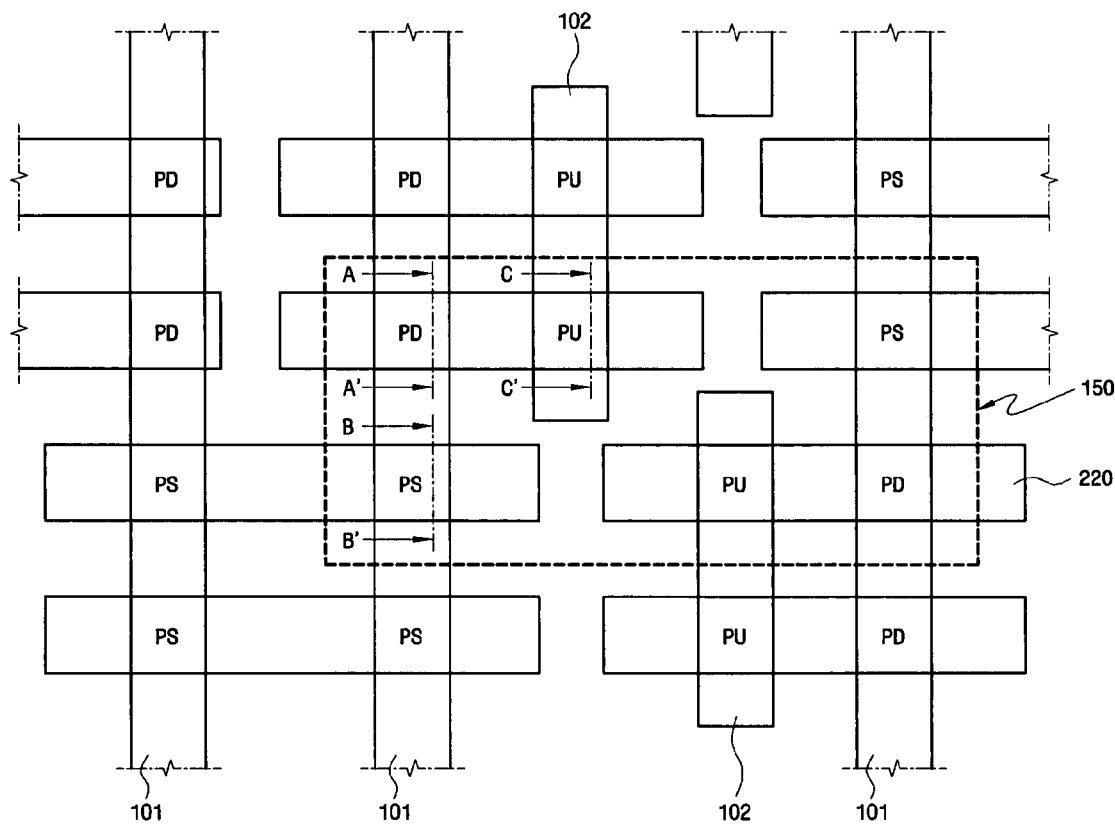
Figure 6B:
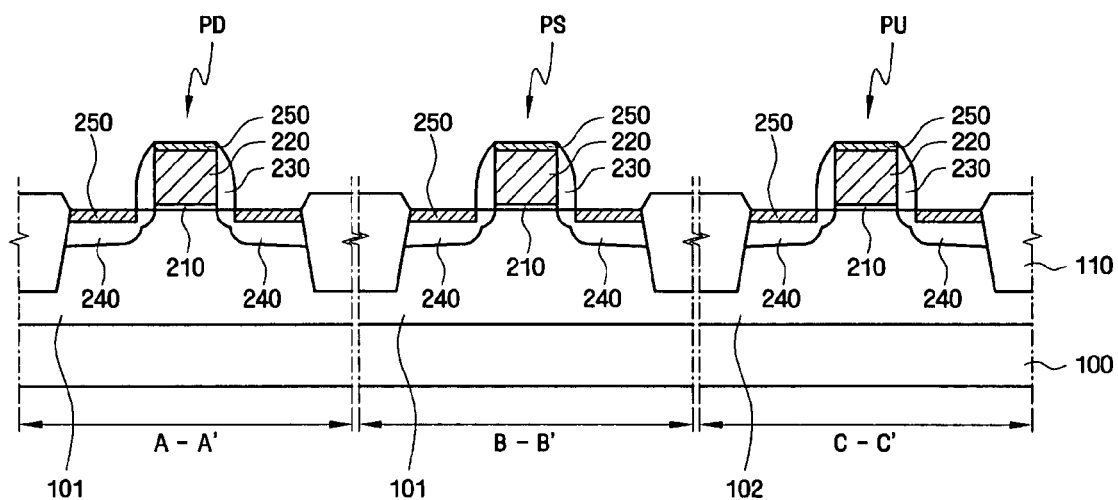

Afterwards, as shown in FIGS. 6A and 6B, the spacers 230, the source and drain regions 240, and the silicide layer 250 may be formed to complete the transistor structure.

In this case, the pull-down transistors PD and the pass transistors PS may be formed in the first active regions 101, and the pull-up transistors PU may be formed in the second active regions 102. The source and drain regions 240 may be formed to have an LDD configuration. The silicide layer 250 may be formed on the gates 220 and the source and drain regions 240.

Additionally, the gates 220 may be used as masks to form N-type and P-type low-concentration impurity regions in the first and second active regions 101 and 102 that may be formed on both sides of each gate 220. That is, N-type impurities, e.g., arsenic (As), may be implanted into the first active regions 101 to form the N-type low-concentration impurity regions. P-type impurities, e.g., boron (B), may be implanted into the second active regions 102 to form the P-type low-concentration impurity regions.

Subsequently, the spacers 230 may be formed. That is, an oxide and/or nitride film(s) used to form the spacers may be formed on the entire surface of the semiconductor substrate 100 including the gates 220. A blanket etch, e.g., an etch-back, may be performed on the oxide and/or nitride film(s) to form the spacers 230 on the both sidewalls of each gate 220.

Next, N-type and P-type high-concentration impurity regions may be formed. That is, the gates 220 and the spacers 230 may be used as ion-implantation masks, and N-type impurities, e.g., arsenic (As), may be implanted into the first active regions 101 to form the N-type high-concentration impurity regions, thereby forming the source and drain regions 240 having an LDD configuration. Further, the gates 220 and the spacers 230 may be used as ion-implantation masks, and P-type impurities, e.g., boron (B), may be implanted into the second active regions 102 to form the P-type high-concentration impurity regions, thereby forming the source and drain regions 240 having a LDD configuration.

Subsequently, a thermal process step may be performed. Rapid temperature processing (RTP) or laser annealing (LSA) may be adopted as the thermal process step.

Figure 7A:
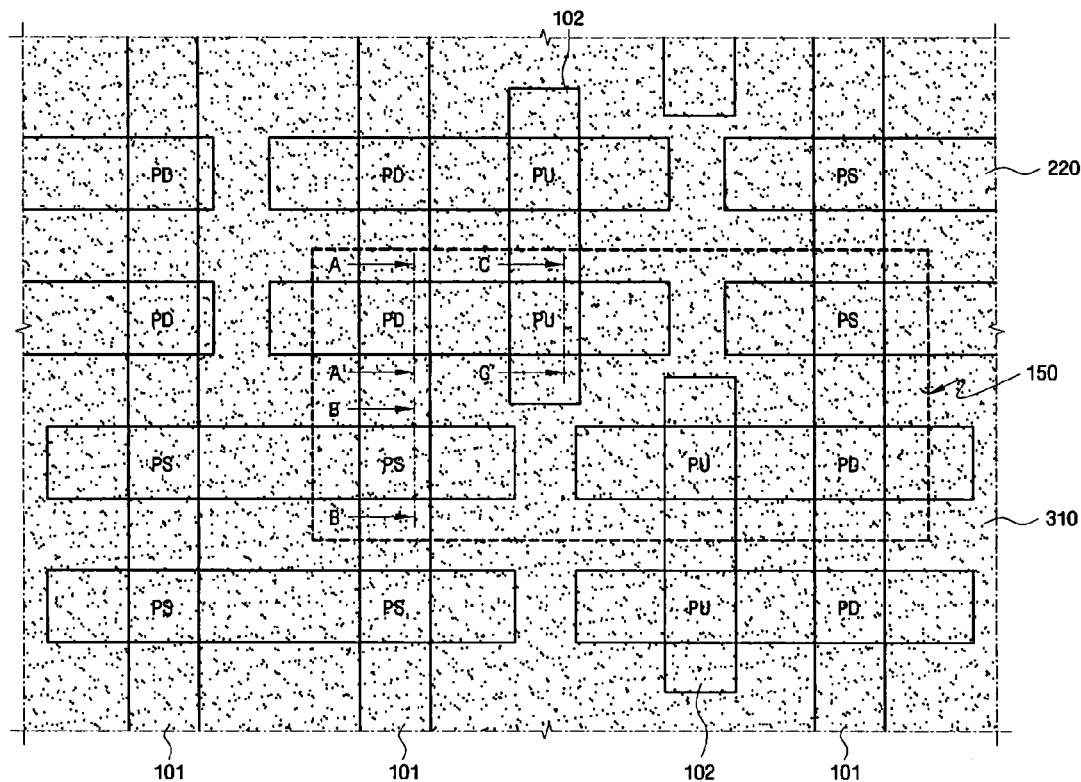
Figure 7B:
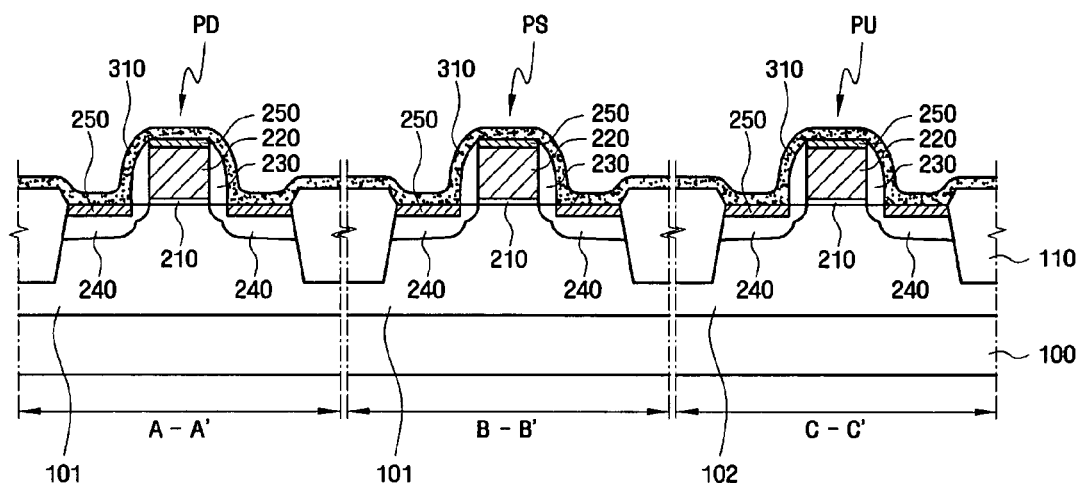

Then, as shown in FIGS. 7A and 7B, the tensile stress film 310 may be formed on the entire surface of the semiconductor substrate 100. The tensile stress film 310 may be formed by, e.g., a low pressure chemical vapor deposition (LPCVD) method.

Figure 8A:
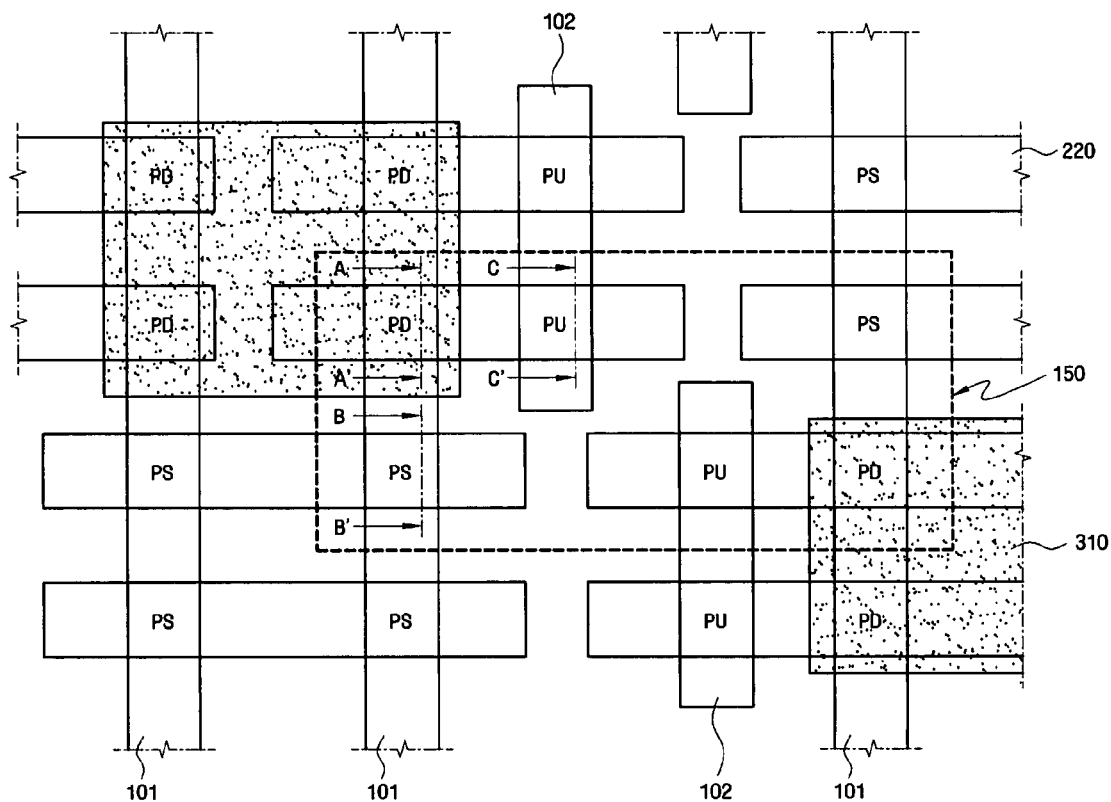
Figure 8B:
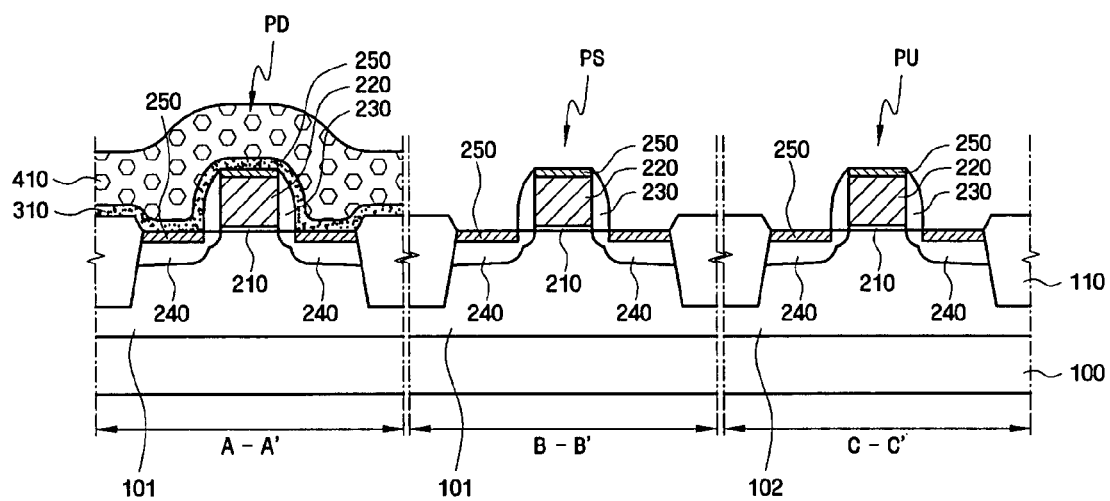

Subsequently, as shown in FIGS. 8A and 8B, the tensile stress film 310 may be removed from regions where the pull-up transistors PU and the pass transistors PS are formed.

That is, after photoresist patterns 410 may be formed in the regions where the pull-down transistors PD are formed, the photoresist patterns 410 may be used as etch masks to remove the tensile stress film 310 from the regions where the pull-up transistors PU and the pass transistors PS are formed. Next, the photoresist patterns 410 may be removed by, e.g., an ashing process, from the regions where the pull-down transistors PD are formed.

Figure 9:
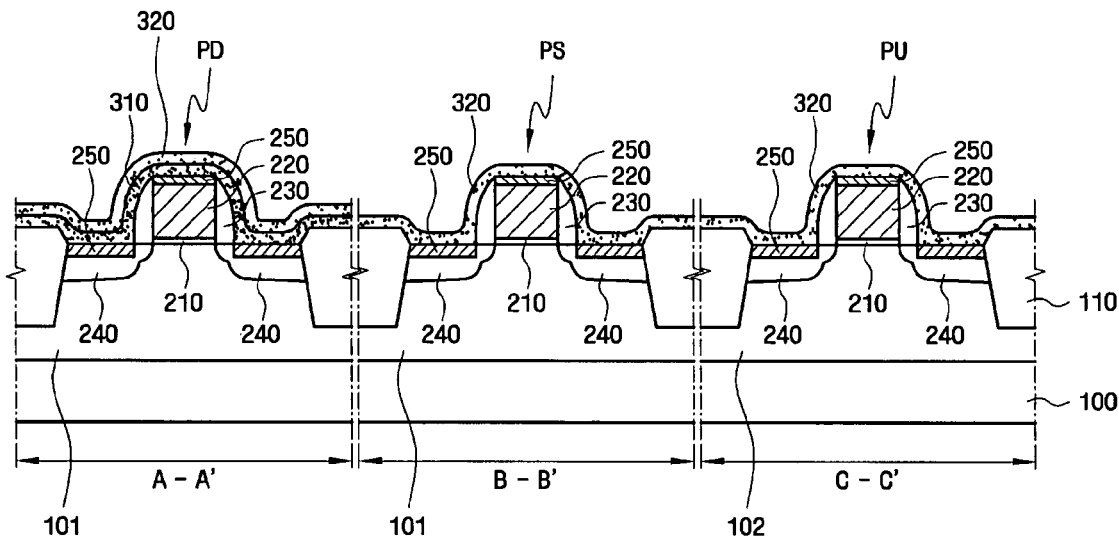

Subsequently, as shown in FIG. 9, the compressive stress film 320 may be formed on the entire surface of the semiconductor substrate 100. The compressive stress film 320 may be formed by, e.g., a plasma enhanced chemical vapor deposition (PECVD) method.

The tensile stress film 310 and /or the compressive stress film 320 may be, e.g., an SiN or $SiN_x$ film. As pressure is lowered and temperature rises during the formation of the SiN or $SiN_x$ film, more tensile stress may be applied to the transistor. Accordingly, the compressive stress film 320 may be formed under lower pressure and higher temperature than the tensile stress film 310.

Figure 10:
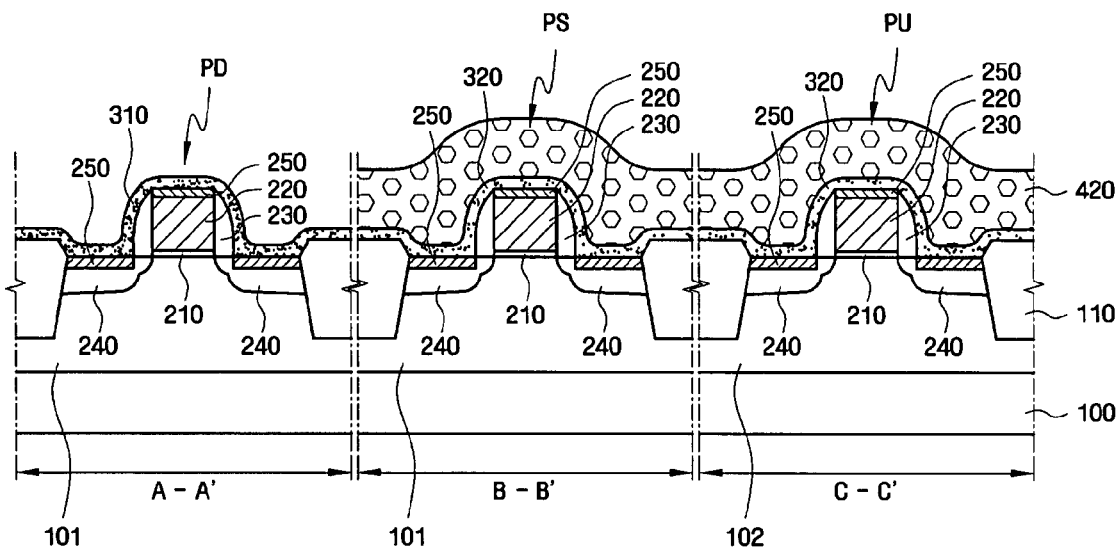

Afterwards, as shown in FIG. 10, the compressive stress film 320 may be removed from the regions of the semiconductor substrate 100 where the pull-down transistors PD are formed.

That is, after photoresist patterns 420 are formed in the regions where the pull-up transistors PU and the pass transistors PS are formed, the photoresist patterns 420 may be used as etch masks to remove the compressive stress film 320 from the regions where the pull-down transistors PD are formed.

Subsequently, as shown in FIGS. 2 and 3, the photoresist patterns 420 may be removed from the regions where the pull-up transistors PU and the pass transistors PS are formed. Therefore, the tensile stress film 310 may be completely formed on the pull-down transistors PD, and the compressive stress film 320 may be completely formed on the pull-up transistors PU and the pass transistors PS.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor integrated circuit device, comprising:
a semiconductor substrate;
a static memory cell on the semiconductor substrate, the static memory cell including a plurality of pull-up transistors and pull-down transistors, which form a latch, and a plurality of pass transistors used to access the latch;
a tensile stress film on the pull-down transistors; and
a compressive stress film on the pass transistors, wherein:
the tensile stress film has a first ratio of N—H bonding to Si—H bonding, the compressive stress film has a second ratio of N—H bonding to Si—H bonding, and the first ratio is smaller than the second ratio.

2. The semiconductor integrated circuit device as claimed in claim 1, wherein a tensile stress of the tensile stress film is about 500 MPa or more.

3. The semiconductor integrated circuit device as claimed in claim 1, wherein an absolute value of a compressive stress of the compressive stress film is about 500 MPa or more.

4. The semiconductor integrated circuit device as claimed in claim 1, wherein each of the pull-down transistors and the pass transistors comprises an NMOS transistor.

5. The semiconductor integrated circuit device as claimed in claim 4, wherein an electron mobility of each pull-down transistor is higher than that of each pass transistor.

6. The semiconductor integrated circuit device as claimed in claim 1, wherein each of the pull-up transistors comprises a PMOS transistor.

7. The semiconductor integrated circuit device as claimed in claim 1, wherein the compressive stress film is additionally on the pull-up transistors.

8. The semiconductor integrated circuit device as claimed in claim 1, wherein:
the first ratio of N—H bonding to Si—H bonding for the tensile stress film ranges from about 1 to 5, and
the second ratio of N—H bonding to Si—H bonding for the compressive film ranges from about 10 to 15.

9. A method of manufacturing a semiconductor integrated circuit device, comprising:
providing a semiconductor substrate;
forming a static memory cell on the semiconductor substrate, the static memory cell including a plurality of pull-up transistors and pull-down transistors, which form a latch, and a plurality of pass transistors used to access to the latch;
forming a tensile stress film on the pull-down transistors; and
forming a compressive stress film on the pass transistors, wherein:
the tensile stress film has a first ratio of N—H bonding to Si—H bonding, the compressive stress film has a second ratio of N—H bonding to Si—H bonding, and the first ratio is smaller than the second ratio.

10. The method as claimed in claim 9, wherein each of the pull-down transistors and the pass transistors comprises an NMOS transistor, and each of the pull-up transistors comprises a PMOS transistor.

11. The method as claimed in claim 10, wherein an electron mobility of each pull-down transistor is higher than that of each pass transistor.

12. The method as claimed in claim 9, wherein the tensile stress film is formed by a low pressure chemical vapor deposition process.

13. The method as claimed in claim 9, wherein the compressive stress film is formed by a pressure enhanced chemical vapor deposition process.

14. The method as claimed in claim 9, wherein the tensile stress film is formed under lower pressure than the compressive stress film.

15. The method as claimed in claim 9, wherein the tensile stress film is formed under higher temperature than the compressive stress film.

16. The method as claimed in claim 9, further comprising forming a compressive stress film on the pull-up transistors.

17. The method as claimed in claim 16, wherein the forming of the tensile stress film on the pull-down transistors and forming of the compressive stress film on the pull-up transistors and the pass transistors comprises:
forming the tensile stress film on the surface of the semiconductor substrate;
removing the tensile stress film from the pull-up transistors and the pass transistors;

forming the compressive stress film on the surface of the semiconductor substrate; and removing the compressive stress film from the pull-down transistors.

18. The method as claimed in claim 16, wherein the forming of the tensile stress film on the pull-down transistors and the forming of the compressive stress film on the pull-up transistors and the pass transistors comprises:

forming the compressive stress film on the surface of the semiconductor substrate;

removing the compressive stress film from the pull-down transistors;

forming the tensile stress film on the surface of the semiconductor substrate; and removing the tensile stress film from the pull-up transistors and the pass transistors.

19. The method as claimed in claim 9, wherein:

the first ratio of N—H bonding to Si—H bonding for the tensile stress film ranges from about 1 to 5, and the second ratio of N—H bonding to Si—H bonding for the compressive film ranges from about 10 to 15.

* * * * *